(12) United States Patent
Lee et al.

(10) Patent No.: US 12,206,018 B2
(45) Date of Patent: Jan. 21, 2025

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Kuo-Hsing Lee, Hsinchu County (TW); Sheng-Yuan Hsueh, Tainan (TW); Chien-Liang Wu, Tainan (TW); Kuo-Yu Liao, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/614,735

(22) Filed: Mar. 24, 2024

(65) Prior Publication Data

US 2024/0234559 A1    Jul. 11, 2024

Related U.S. Application Data

(63) Continuation of application No. 18/144,822, filed on May 8, 2023, now Pat. No. 11,973,133, which is a (Continued)

(30) Foreign Application Priority Data

Jul. 21, 2020  (CN) .......................... 202010704978.1

(51) Int. Cl.
*H01L 29/778* (2006.01)
*H01L 27/06* (2006.01)
(Continued)

(52) U.S. Cl.
CPC ........ *H01L 29/778* (2013.01); *H01L 27/0629* (2013.01); *H01L 29/0649* (2013.01); *H01L 29/2003* (2013.01); *H01L 29/66462* (2013.01)

(58) Field of Classification Search
CPC ........... H01L 29/66462; H01L 27/0629; H01L 29/0649; H01L 21/8252; H01L 29/778; H01L 29/2003; H01L 29/1066; H01L 29/7786; H01L 29/41766; H01L 28/40; H01L 27/0623; H01L 23/291; H01L 27/0605; H01L 29/737; H01L 29/42304; H01L 29/66318; H01L 29/41708; H01L 29/401; H01L 23/66; H01L 23/3171; H01L 29/495; H01L 23/485; H01L 29/4175;
(Continued)

(56) References Cited

U.S. PATENT DOCUMENTS 11,276,764 B1    3/2022  Yang
2006/0197134 A1    9/2006  Phan
(Continued)

FOREIGN PATENT DOCUMENTS

CN    104158503    11/2014

*Primary Examiner* — Mouloucoulaye Inoussa
(74) *Attorney, Agent, or Firm* — Winston Hsu

(57) ABSTRACT

A method for fabricating a semiconductor device includes the steps of first providing a substrate having a high electron mobility transistor (HEMT) region and a capacitor region, forming a buffer layer on the substrate, forming a mesa isolation on the HEMT region, forming a HEMT on the mesa isolation, and then forming a capacitor on the capacitor region. Preferably, a bottom electrode of the capacitor contacts the buffer layer directly.

5 Claims, 9 Drawing Sheets

Related U.S. Application Data continuation of application No. 16/994,646, filed on Aug. 16, 2020, now Pat. No. 11,688,800.

(51) Int. Cl.
  *H01L 29/06* (2006.01)
  *H01L 29/20* (2006.01)
  *H01L 29/66* (2006.01)

(58) Field of Classification Search
  CPC ......... H01L 21/76898; H01L 23/53238; H01L 23/481; H01L 29/475; H01L 29/452; H01L 23/5226; H01L 21/28264; H01L 21/28581; H01L 21/76877; H01L 21/76805; H01L 21/28575; H01L 21/28587; H01L 29/41758; H01L 29/7787; H01L 21/76816; H01L 29/42384; H01L 27/1052; H01L 29/78696; H01L 29/78648; H01L 27/1225; H01L 27/1251; H01L 29/7869; H01L 27/127; H01L 27/0694; H01L 21/8221; H01L 21/8258; H01L 29/205; H01L 21/743; H01L 27/0255; H01L 29/866; H01L 29/66212; H01L 27/0688; H01L 27/0883; H01L 2223/6672; H01L 2223/6616; H01L 2224/0401
  See application file for complete search history.

(56) References Cited

U.S. PATENT DOCUMENTS

| | | |
|---|---|---|
| 2007/0170548 A1 | 7/2007 | Akamatsu |
| 2007/0267705 A1 | 11/2007 | Won |
| 2013/0020570 A1 | 1/2013 | Yamazaki |
| 2013/0026541 A1 | 1/2013 | Kurokawa |
| 2013/0043485 A1* | 2/2013 | Ueno .................. H01L 21/8252 257/E29.091 |
| 2013/0178021 A1 | 7/2013 | Cheng |
| 2013/0200365 A1 | 8/2013 | Yamazaki |
| 2013/0203214 A1 | 8/2013 | Isobe |
| 2013/0277680 A1 | 10/2013 | Green |
| 2015/0137135 A1 | 5/2015 | Green |
| 2015/0318276 A1* | 11/2015 | Bayram ................. H01L 29/16 257/195 |
| 2015/0348997 A1 | 12/2015 | Sasagawa |
| 2016/0247832 A1 | 8/2016 | Suzawa |
| 2017/0018617 A1 | 1/2017 | Xia et al. |
| 2017/0025406 A1* | 1/2017 | Liao .................... H01L 27/0605 |
| 2017/0170233 A1 | 6/2017 | Tsai |
| 2018/0247956 A1* | 8/2018 | Stamper .............. H01L 29/0847 |
| 2020/0373302 A1 | 11/2020 | Onuki |

* cited by examiner

HIGH ELECTRON MOBILITY TRANSISTOR AND METHOD FOR FABRICATING THE SAME

CROSS REFERENCE TO RELATED APPLICATIONS

This application is a continuation application of U.S. application Ser. No. 18/144,822, filed on May 8, 2023, which is a continuation application of U.S. application Ser. No. 16/994,646, filed on Aug. 16, 2020. The contents of these applications are incorporated herein by reference.

BACKGROUND OF THE INVENTION

1. Field of the Invention

The invention relates to a semiconductor device, and more particularly to a semiconductor device having integrated a high electron mobility transistor (HEMT) and a capacitor.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

A semiconductor device includes a substrate having a high electron mobility transistor (HEMT) region and a capacitor region, a first mesa isolation on the HEMT region, a HEMT on the first mesa isolation, a second mesa isolation on the capacitor region, and a capacitor on the second mesa isolation. The semiconductor device further includes buffer layer between the substrate, the first mesa isolation, and the second mesa isolation, in which bottom surfaces of the first mesa isolation and the second mesa isolation are coplanar.

According to another aspect of the present invention, a semiconductor device includes a substrate having a high electron mobility transistor (HEMT) region and a capacitor region, a mesa isolation on the HEMT region, a HEMT on the mesa isolation, a capacitor on the capacitor region, and a buffer layer between the mesa isolation, the capacitor, and substrate.

According to yet another aspect of the present invention, a semiconductor device includes a substrate having a high electron mobility transistor (HEMT) region and a capacitor region, a mesa isolation on the HEMT region, a HEMT on the mesa isolation, a hard mask around the HEMT and extending to the capacitor region, and a capacitor on the hard mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
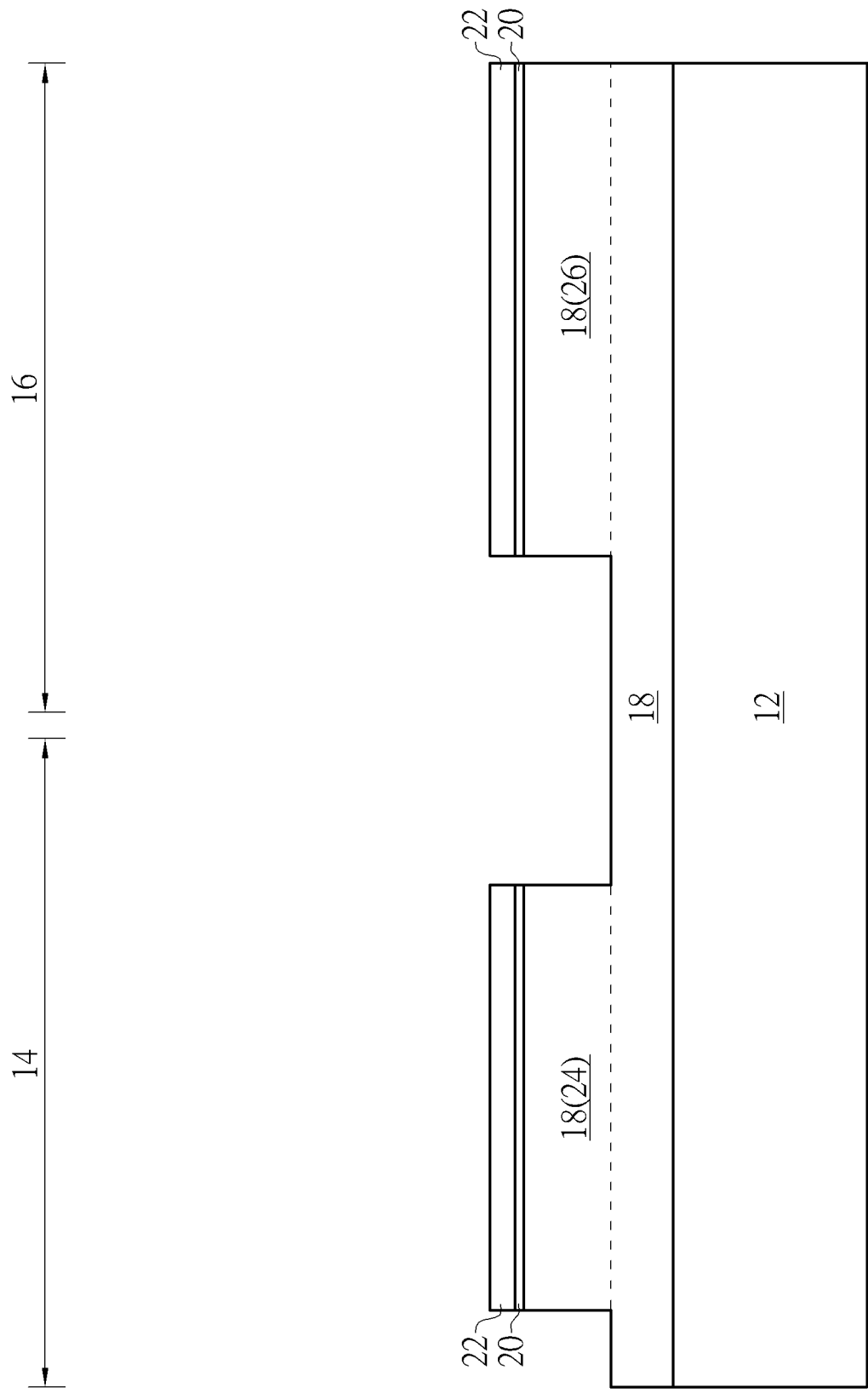
FIGS. 1-3 illustrate a method for fabricating a HEMT according to an embodiment of the present invention.
Figure 2:
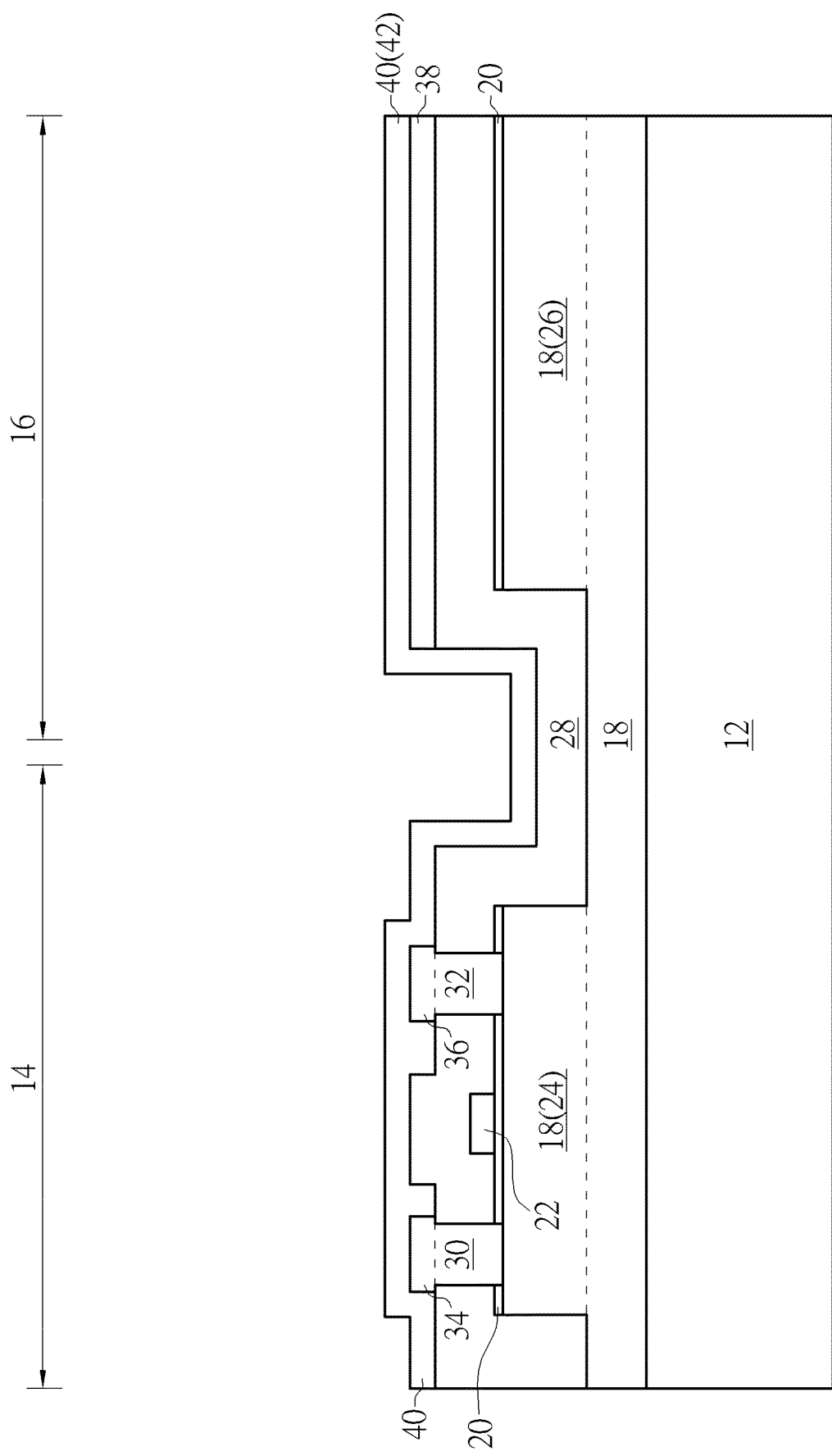
Figure 3:
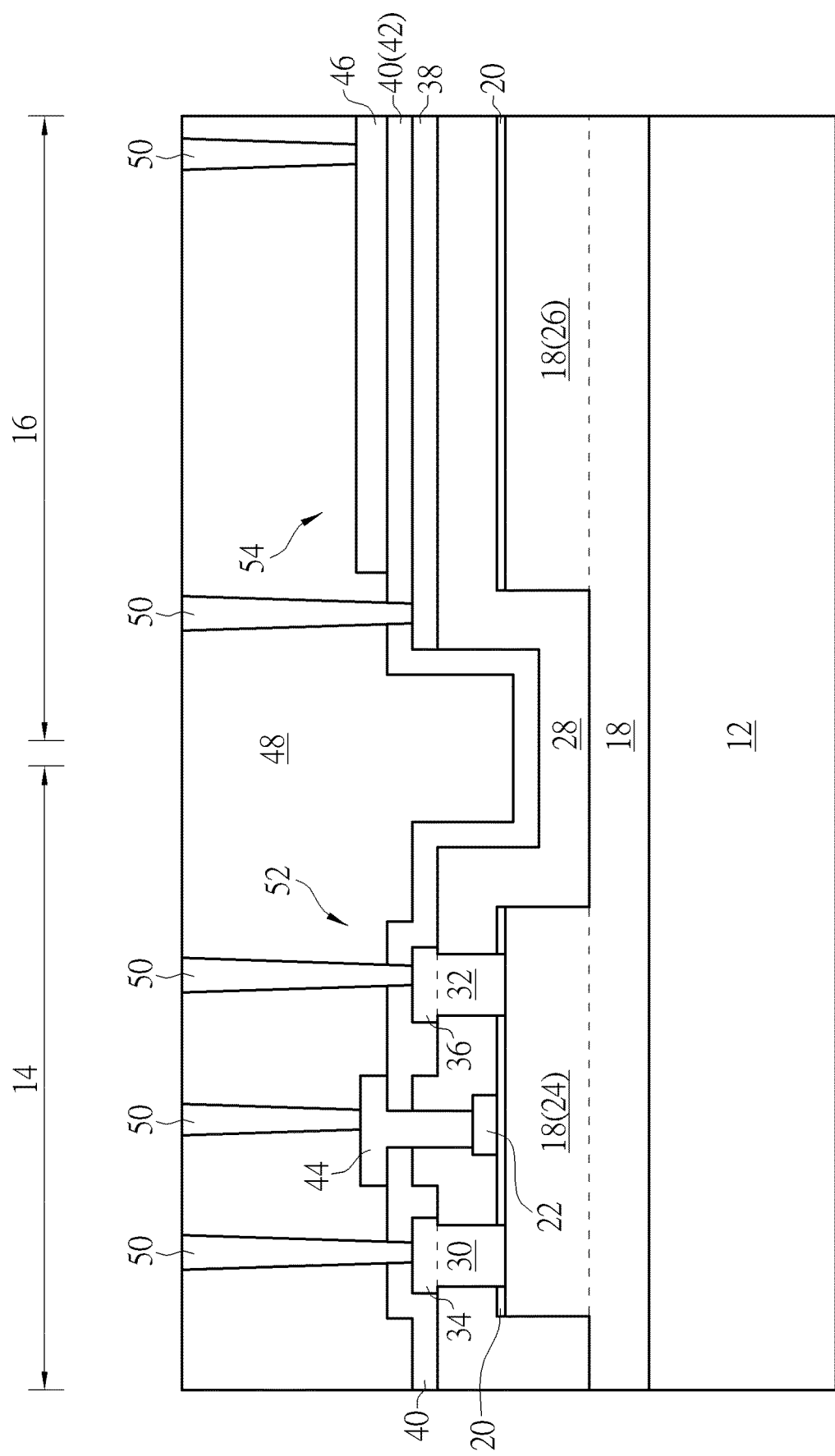

Referring to the FIGS. 1-3, FIGS. 1-3 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate. Next, a HEMT region 14 and a capacitor region 16 are defined on the substrate 12.

Next, a buffer layer 18 is formed on the surface of the substrate 12. According to an embodiment of the present invention, the buffer layer 18 is preferably made of III-V semiconductors such as gallium nitride (GaN), in which a thickness of the buffer layer 18 could be between 0.5 microns to 10 microns. According to an embodiment of the present invention, the formation of the buffer layer 18 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 20 is formed on the surface of the buffer layer 18. In this embodiment, the barrier layer 20 is preferably made of III-V semiconductor such as aluminum gallium nitride ($Al_xGa_{1-x}N$), in which 0<x<1, x being less than or equal to 20%, and the barrier layer 20 preferably includes an epitaxial layer formed through epitaxial growth process. Similar to the buffer layer 18, the formation of the barrier layer 20 on the buffer layer 18 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. It should be noted that even though the barrier layer 20 is formed directly on the surface of the buffer layer 18, according to another embodiment of the present invention, it would also be desirable to form an extra metal nitride layer (not shown) including but not limited to for example aluminum nitride (AlN) between the buffer layer 18 and the barrier layer 20, which is also within the scope of the present invention.

Next, a p-type semiconductor layer 22 is formed on the barrier layer 20. In this embodiment, the p-type semiconductor layer 22 preferably is a III-V compound layer including p-type GaN (p-GaN) and the formation of the p-type semiconductor layer 22 on the surface of the barrier layer 20 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a MESA isolation process is conducted to form mesa isolations 24, 26 on the HEMT region 14 and capacitor region 16 respectively so that devices could be isolated to operate independently without affecting each other. In this embodiment, the MESA isolation process could be accomplished by conducting a photo-etching process to remove part of p-type semiconductor layer 22, part of the barrier layer 20, and part of the buffer layer 18, in which the patterned p-type semiconductor layer 22, the patterned barrier layer 20, and the patterned buffer layer 18 preferably share equal widths and edges of the three layers are aligned. The width of the remaining un-patterned buffer layer 18 is preferably equal to the width of the substrate 12. Preferably, each of the mesa isolations 24, 26 includes a patterned buffer layer 18, in which the thickness of the patterned buffer layer 18 is approximately 300 nm, the thickness of the patterned barrier layer 20 is approximately 10 nm, and the thickness of the patterned p-type semiconductor layer 22 is approximately 100 nm.

Next, as shown in FIG. 2, a photo-etching process is conducted to remove part of the p-type semiconductor layer 22 on the HEMT region 14 and all of the p-type semiconductor layer 22 on the capacitor region 16 so that the remaining p-type semiconductor layer 22 is only disposed on the barrier layer 20 on HEMT region 14 while none of the p-type semiconductor layer 22 is remained on the surface of the barrier layer 20 on capacitor region 16, in which the patterned p-type semiconductor layer 22 preferably serves as part of the gate structure for the HEMT device in the later process. Next, a hard mask 28 is conformally formed on the buffer layer 18 to cover the mesa isolations 24, 26 on the HEMT region 14 and the capacitor region 16. In this embodiment, the hard mask 28 preferably includes silicon nitride and the thickness of the hard mask 28 is approximately 200 nm, but not limited thereto.

Next, one or more photo-etching process is conducted to remove part of the hard mask 28 and part of the barrier layer 20 on the HEMT region 14 for forming a plurality of recesses (not shown), a conductive material is formed into the recesses and on the surface of the hard mask 28 on both HEMT region 14 and capacitor region 16, and a pattern transfer process is conducted to remove part of the conductive material. Preferably, the conductive material deposited into the recesses on the HEMT region 14 serves as a source electrode 30 and drain electrode 32, the conductive material disposed on the source electrode 30 and drain electrode 32 and extended to the surface of the hard mask 28 adjacent to two sides of the source electrode 30 and drain electrode 32 serves as a source electrode extension 34 and drain electrode extension 36, and the conductive material being patterned on the surface of the hard mask 28 on the capacitor region 16 preferably serves as a bottom electrode 38 for the capacitor. Next, another hard mask 40 is formed on the surface of hard mask 28 on the HEMT region 14 and extending to the bottom electrode 38 on the capacitor region 16, in which the hard mask 40 on the capacitor region 16 preferably serves as a capacitor dielectric layer 42. In this embodiment, the thickness of the capacitor dielectric layer 42 is between 20-100 nm, but not limited thereto.

Next, as shown in FIG. 3, one or more photo-etching process is conducted to remove part of the hard mask 40 and part of the hard mask 28 on the HEMT region 14 for forming a recess exposing the p-type semiconductor layer 22, another conductive material is formed on the hard mask 40 on HEMT region 14 to fill the recess completely while covering the surface of the hard mask 40 on the capacitor region 16, and a pattern transfer process is conducted to remove part of the conductive material, in which the conductive material deposited into the recess and part of the conductive material on the surface of the hard mask 40 on the HEMT region 14 preferably serves as a gate electrode 44 while the patterned conductive material layer on the capacitor region 16 serves as a top electrode for the capacitor.

In this embodiment, the gate electrode 44, source electrode 30, and drain electrode 32 are preferably made of metal, in which gate electrode 44 preferably includes Schottky metal while the source electrode 30 and the drain electrode 32 are preferably made of ohmic contact metals. According to an embodiment of the present invention, each of the gate electrode 44, source electrode 30, and drain electrode 32 could include gold (Au), silver (Ag), platinum (Pt), titanium (Ti), aluminum (Al), tungsten (W), palladium (Pd), or combination thereof. Moreover, it would be desirable to conduct an electroplating process, sputtering process, resistance heating evaporation process, electron beam evaporation process, physical vapor deposition (PVD) process, chemical vapor deposition (CVD) process, or combination thereof to form conductive materials in the aforementioned recesses and then pattern the conductive materials through single or multiple etching processes for forming the gate electrode 44, the source electrode 30, and the drain electrode 32.

Next, a contact plug formation could be conducted to form contact plugs 50 electrically connected to the gate electrode 44, source electrode 30, and drain electrode 32 on the HMET region 14 and the bottom electrode 38 and top electrode 46 on the capacitor region 16. In this embodiment, the formation of contact plugs 50 could be accomplished by first forming an interlayer dielectric (ILD) layer 48 on the hard mask 40 on both HEMT region 14 and capacitor region 16, removing part of the ILD layer 48 and part of the hard mask 40 to form contact holes (not shown), and then depositing a barrier layer (not shown) and a metal layer (not shown) into the contact holes. A planarizing process, such as chemical mechanical polishing (CMP) process is then conducted to remove part of the metal layer, part of the barrier layer, and even part of the ILD layer 48 to form contact plugs 50 in the contact holes, in which the top surface of the contact plugs 50 is even with the top surface of the ILD layer 48. In this embodiment, the barrier layer is selected from the group consisting of Ti, Ta, TiN, TaN, and WN and the metal layer is selected from the group consisting of Al, Ti, Ta, W, Nb, Mo, and Cu.

Referring again to FIG. 3, FIG. 3 further illustrates a structural view of a semiconductor device according to an embodiment of the present invention. As shown in FIG. 3, the semiconductor device preferably includes a HEMT region 14 and a capacitor region 16 defined on the substrate 12, a mesa isolation 24 disposed on the HEMT region 14, a HEMT 52 disposed on the mesa isolation 24, another mesa isolation 26 disposed on the capacitor region 16, a buffer layer 18 disposed on the substrate 12 and between the mesa isolations 24, 26, and a capacitor 54 disposed on the mesa isolation 26, in which the bottom surfaces of the mesa isolations 24, 26 are coplanar and both mesa isolations 24, 26 includes GaN.

The HEMT 52 includes a barrier layer 20 disposed on the mesa isolation 24, a p-type semiconductor layer 22 disposed on the barrier layer 20, a gate electrode 44 disposed on the p-type semiconductor layer 22, a source electrode 30 and drain electrode 32 adjacent to two sides of the gate electrode 44, a source electrode extension 34 disposed on the source electrode 30, a drain electrode extension 36 disposed on the drain electrode 32, and a hard mask 28 disposed on the mesa isolations 24, 26 and surrounding the source electrode 30 and drain electrode 32.

The capacitor 54 includes a bottom electrode 38 disposed on the hard mask 28, a capacitor dielectric layer 42 disposed on the bottom electrode 38 and extending to the top surface and sidewall of the hard mask 28 on the HEMT region 14, and a top electrode 46 disposed on the capacitor dielectric layer 42, in which the bottom surface of the bottom electrode 38 is even with the bottom surface of the source electrode extension 34 while the top surface of the top electrode 46 is even with the top surface of the gate electrode 44.

Figure 4:
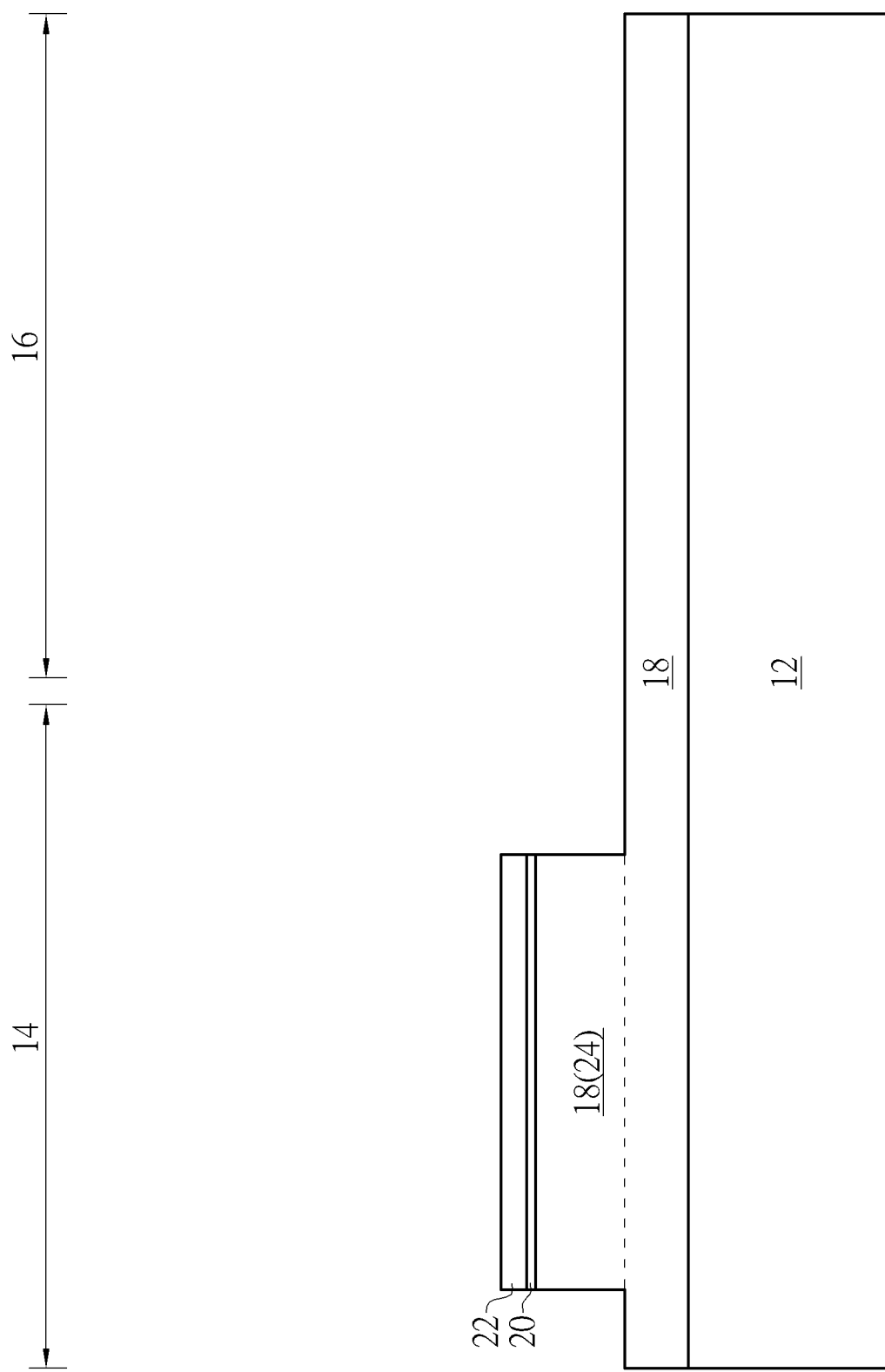
FIGS. 4-6 illustrate a method for fabricating a HEMT according to an embodiment of the present invention.
Figure 5:
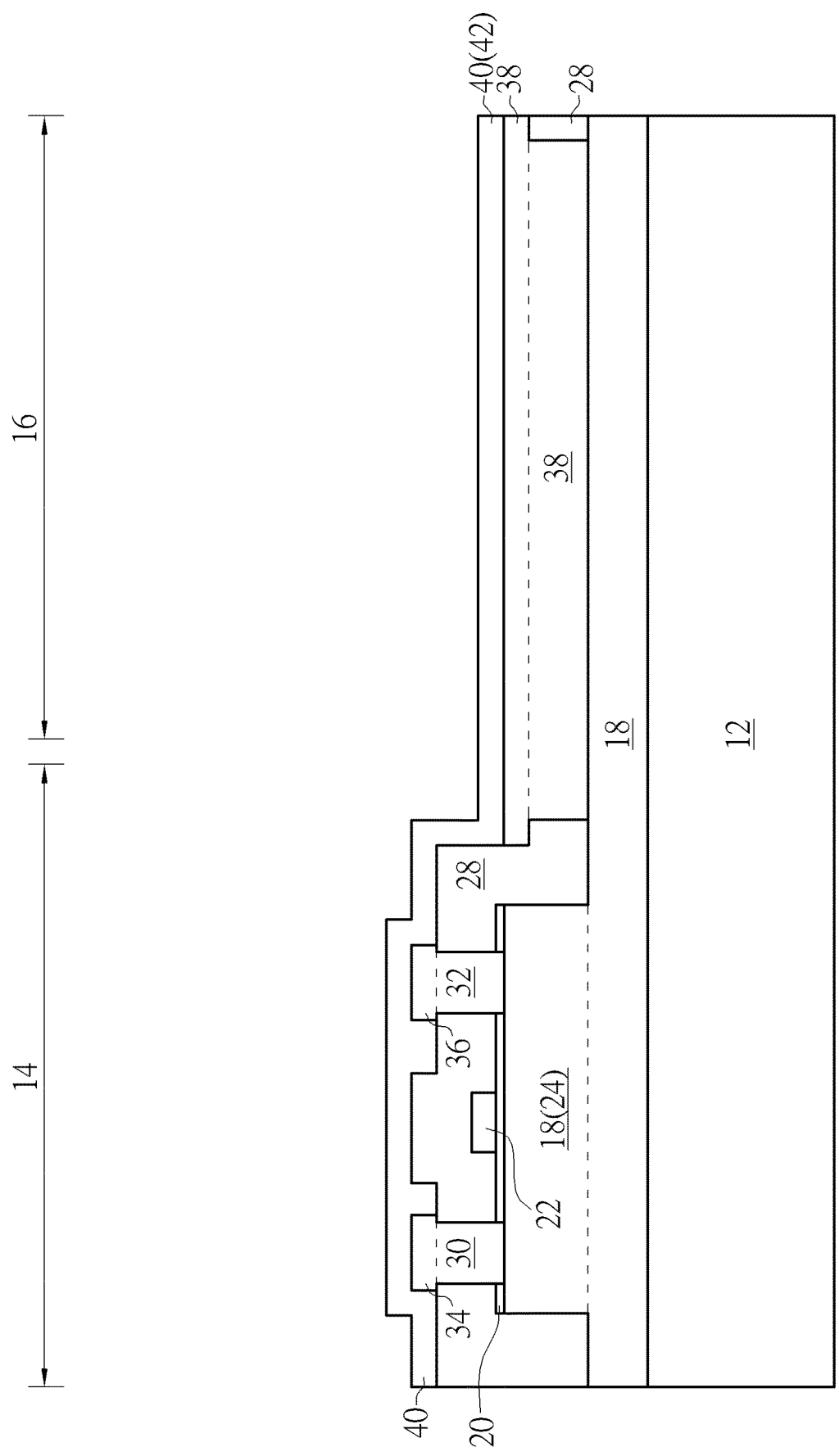
Figure 6:
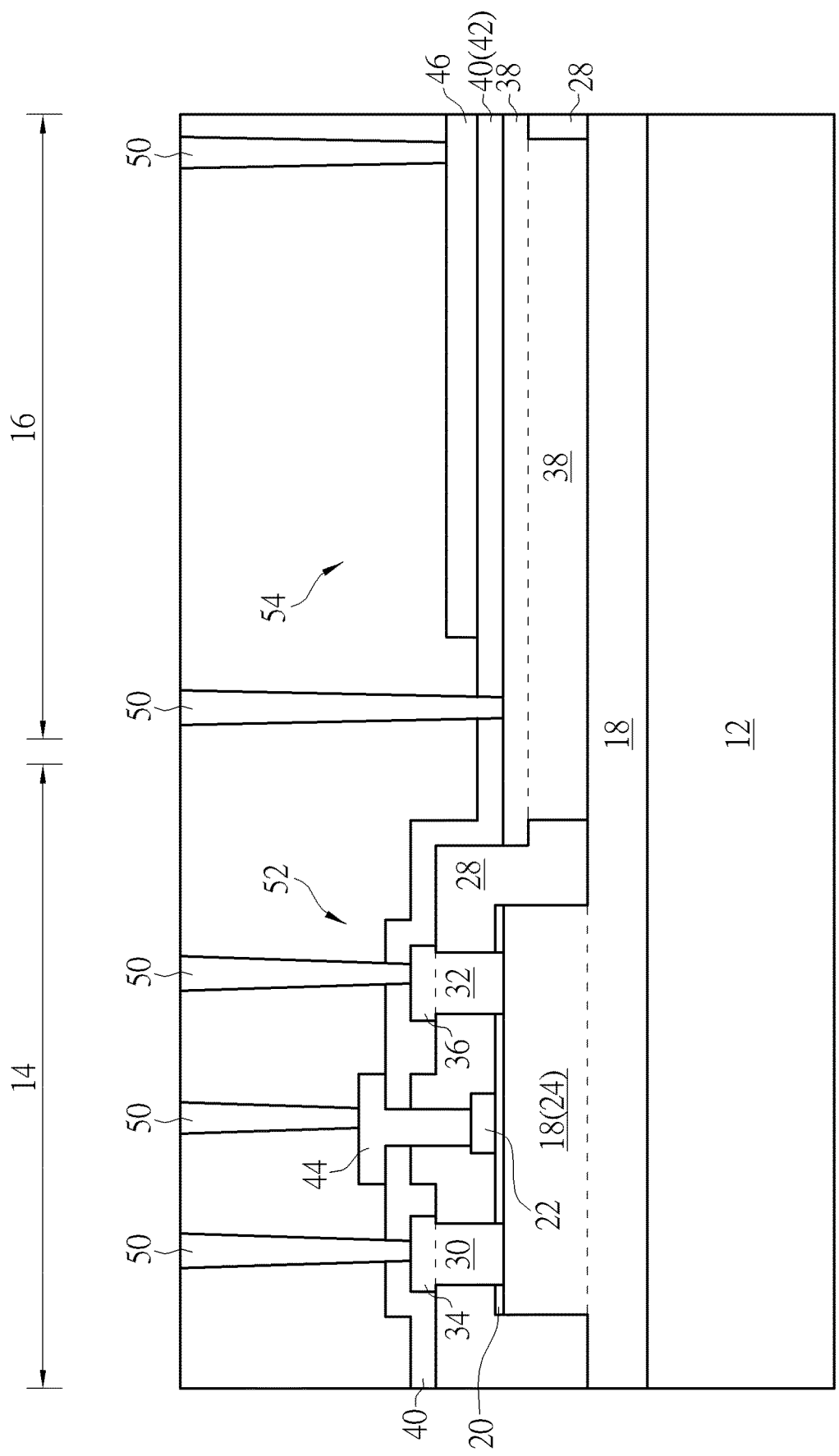

Referring to FIGS. 4-6, FIGS. 4-6 illustrate a method for fabricating a HEMT according to an embodiment of the present invention. For simplicity purpose, elements from the aforementioned embodiments are labeled with same numberings. As shown in the FIG. 4, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate. Next, a HEMT region 14 and a capacitor region 16 are defined on the substrate 12.

Next, a buffer layer 18 is formed on the surface of the substrate 12. According to an embodiment of the present invention, the buffer layer 18 is preferably made of III-V semiconductors such as gallium nitride (GaN), in which a thickness of the buffer layer 18 could be between 0.5 microns to 10 microns. According to an embodiment of the present invention, the formation of the buffer layer 18 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 20 is formed on the surface of the buffer layer 18. In this embodiment, the barrier layer 20 is preferably made of III-V semiconductor such as aluminum gallium nitride ($Al_xGa_{1-x}N$), in which 0<x<1, x being less than or equal to 20%, and the barrier layer 20 preferably includes an epitaxial layer formed through epitaxial growth process. Similar to the buffer layer 18, the formation of the barrier layer 20 on the buffer layer 18 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. It should be noted that even though the barrier layer 20 is formed directly on the surface of the buffer layer 18, according to another embodiment of the present invention, it would also be desirable to form an extra metal nitride layer (not shown) including but not limited to for example aluminum nitride (AlN) between the buffer layer 18 and the barrier layer 20, which is also within the scope of the present invention.

Next, a p-type semiconductor layer 22 is formed on the barrier layer 20. In this embodiment, the p-type semiconductor layer 22 preferably is a III-V compound layer including p-type GaN (p-GaN) and the formation of the p-type semiconductor layer 22 on the surface of the barrier layer 20 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a MESA isolation process is conducted to form a mesa isolation 24 on the HEMT region 14. In this embodiment, the MESA isolation process could be accomplished by conducting a photo-etching process to remove part of p-type semiconductor layer 22, part of the barrier layer 20, and part of the buffer layer 18, in which the patterned p-type semiconductor layer 22, the patterned barrier layer 20, and the patterned buffer layer 18 preferably share equal widths and edges of the three layers are aligned. The width of the remaining un-patterned buffer layer 18 is preferably equal to the width of the substrate 12. Preferably, the mesa isolation 24 includes a patterned buffer layer 18, in which the thickness of the patterned buffer layer 18 is approximately 300 nm, the thickness of the patterned barrier layer 20 is approximately 10 nm, and the thickness of the patterned p-type semiconductor layer 22 is approximately 100 nm.

Next, as shown in FIG. 5, a photo-etching process is conducted to remove part of the p-type semiconductor layer 22 on the HEMT region 14, in which the patterned p-type semiconductor layer 22 preferably serves as part of the gate structure for the HEMT device in the later process. Next, a hard mask 28 is conformally formed on the buffer layer 18 to cover the mesa isolation 24 on the HEMT region 14 while extending to the buffer layer 18 on the capacitor region 16. In this embodiment, the hard mask 28 preferably includes silicon nitride and the thickness of the hard mask 28 is approximately 200 nm, but not limited thereto.

Next, one or more photo-etching process is conducted to remove part of the hard mask 28 and part of the barrier layer 20 on the HEMT region 14 and majority of the hard mask 28 on the capacitor region 16 for forming a plurality of recesses (not shown), a conductive material is formed into the recesses on both HEMT region 14 and capacitor region 16, and a pattern transfer process is conducted to remove part of the conductive material. Preferably, the conductive material deposited into the recesses on the HEMT region 14 serves as a source electrode 30 and drain electrode 32, the conductive material disposed on the source electrode 30 and drain electrode 32 and extended to the surface of the hard mask 28 adjacent to two sides of the source electrode 30 and drain electrode 32 serves as a source electrode extension 34 and drain electrode extension 36, and the conductive material being formed into the recess or trench on the capacitor region 16 preferably serves as a bottom electrode 38 for the capacitor. Next, another hard mask 40 is formed on the surface of hard mask 28 on the HEMT region 14 and extending to the bottom electrode 38 on the capacitor region 16, in which the hard mask 40 on the capacitor region 16 preferably serves as a capacitor dielectric layer 42. In this embodiment, the thickness of the capacitor dielectric layer 42 is between 20-100 nm, but not limited thereto.

Next, as shown in FIG. 6, one or more photo-etching process is conducted to remove part of the hard mask 40 and part of the hard mask 28 on the HEMT region 14 for forming a recess exposing the p-type semiconductor layer 22, another conductive material is formed on the hard mask 40 on HEMT region 14 to fill the recess completely while covering the surface of the hard mask 40 on the capacitor region 16, and a pattern transfer process is conducted to remove part of the conductive material, in which the conductive material deposited into the recess and part of the conductive material on the surface of the hard mask 40 on the HEMT region 14 preferably serves as a T-shape gate electrode 44 while the patterned conductive material layer on the capacitor region 16 serves as a top electrode 46 for the capacitor.

Similar to the aforementioned embodiment, the gate electrode 44, source electrode 30, and drain electrode 32 are preferably made of metal, in which gate electrode 44 preferably includes Schottky metal while the source electrode 30 and the drain electrode 32 are preferably made of ohmic contact metals. According to an embodiment of the present invention, each of the gate electrode 44, source electrode 30, and drain electrode 32 could include gold (Au), silver (Ag), platinum (Pt), titanium (Ti), aluminum (Al), tungsten (W), palladium (Pd), or combination thereof. Moreover, it would be desirable to conduct an electroplating process, sputtering process, resistance heating evaporation process, electron beam evaporation process, physical vapor deposition (PVD) process, chemical vapor deposition (CVD) process, or combination thereof to form conductive materials in the aforementioned recesses and then pattern the conductive materials through single or multiple etching processes for forming the gate electrode 44, the source electrode 30, and the drain electrode 32.

Next, a contact plug formation could be conducted to form contact plugs 50 electrically connected to the gate electrode 44, source electrode 30, and drain electrode 32 on the HMET region 14 and the bottom electrode 38 and top electrode 46 on the capacitor region 16. In this embodiment, the formation of contact plugs 50 could be accomplished by first forming an interlayer dielectric (ILD) layer 48 on the hard mask 40 on both HEMT region 14 and capacitor region 16, removing part of the ILD layer 48 and part of the hard mask 40 to form contact holes (not shown), and then depositing a barrier layer (not shown) and a metal layer (not shown) into the contact holes. A planarizing process, such as chemical mechanical polishing (CMP) process is then conducted to remove part of the metal layer, part of the barrier layer, and even part of the ILD layer 48 to form contact plugs 50 in the contact holes, in which the top surface of the contact plugs 50 is even with the top surface of the ILD layer 48. In this embodiment, the barrier layer is selected from the group consisting of Ti, Ta, TiN, TaN, and WN and the metal layer is selected from the group consisting of Al, Ti, Ta, W, Nb, Mo, and Cu.

Referring again to FIG. 6, FIG. 6 further illustrates a structural view of a semiconductor device according to an embodiment of the present invention. As shown in FIG. 6, the semiconductor device preferably includes a HEMT region 14 and a capacitor region 16 defined on the substrate 12, a mesa isolation 24 disposed on the HEMT region 14, a HEMT 52 disposed on the mesa isolation 24, a capacitor 54 disposed on the capacitor region 16, and a buffer layer 18 disposed between the mesa isolation 24, the capacitor 54, and the substrate 12, in which the mesa isolation 24 and the buffer layer 18 both include GaN.

The HEMT 52 includes a barrier layer 20 disposed on the mesa isolation 24, a p-type semiconductor layer 22 disposed on the barrier layer 20, a gate electrode 44 disposed on the p-type semiconductor layer 22, a source electrode 30 and drain electrode 32 adjacent to two sides of the gate electrode 44, a source electrode extension 34 disposed on the source electrode 30, a drain electrode extension 36 disposed on the drain electrode 32, and a hard mask 28 disposed on the mesa isolation 24 and surrounding the source electrode 30 and drain electrode 32.

The capacitor 54 on the other hand includes a bottom electrode 38 disposed on the hard mask 28, a capacitor dielectric layer 42 disposed on the bottom electrode 38 while extending to the top surface and sidewall of the hard mask 28 on the HEMT region 14, and a top electrode 46 disposed on the capacitor dielectric layer 42. In contrast to the aforementioned embodiment having mesa isolations 24, 26 on both HEMT region 14 and capacitor region 16, only a mesa isolation 24 is disposed on the HEMT region 14 in this embodiment while the capacitor region 16 includes no mesa isolation so that the bottom electrode 38 would contact the top surface of the buffer layer 18 directly while having a T-shape cross-section. Moreover, the overall thickness of the bottom electrode 38 is substantially equal to the combined thickness of the source electrode 30 and source electrode extension 34 or the combined thickness of the drain electrode 32 and drain electrode extension 36 on the HEMT region 14. Preferably, the overall thickness of the bottom electrode 38 is about 300 nm, the thickness of the capacitor dielectric layer 42 is between 20-100 nm, and the thickness of the top electrode 46 is about 100 nm.

Figure 7:
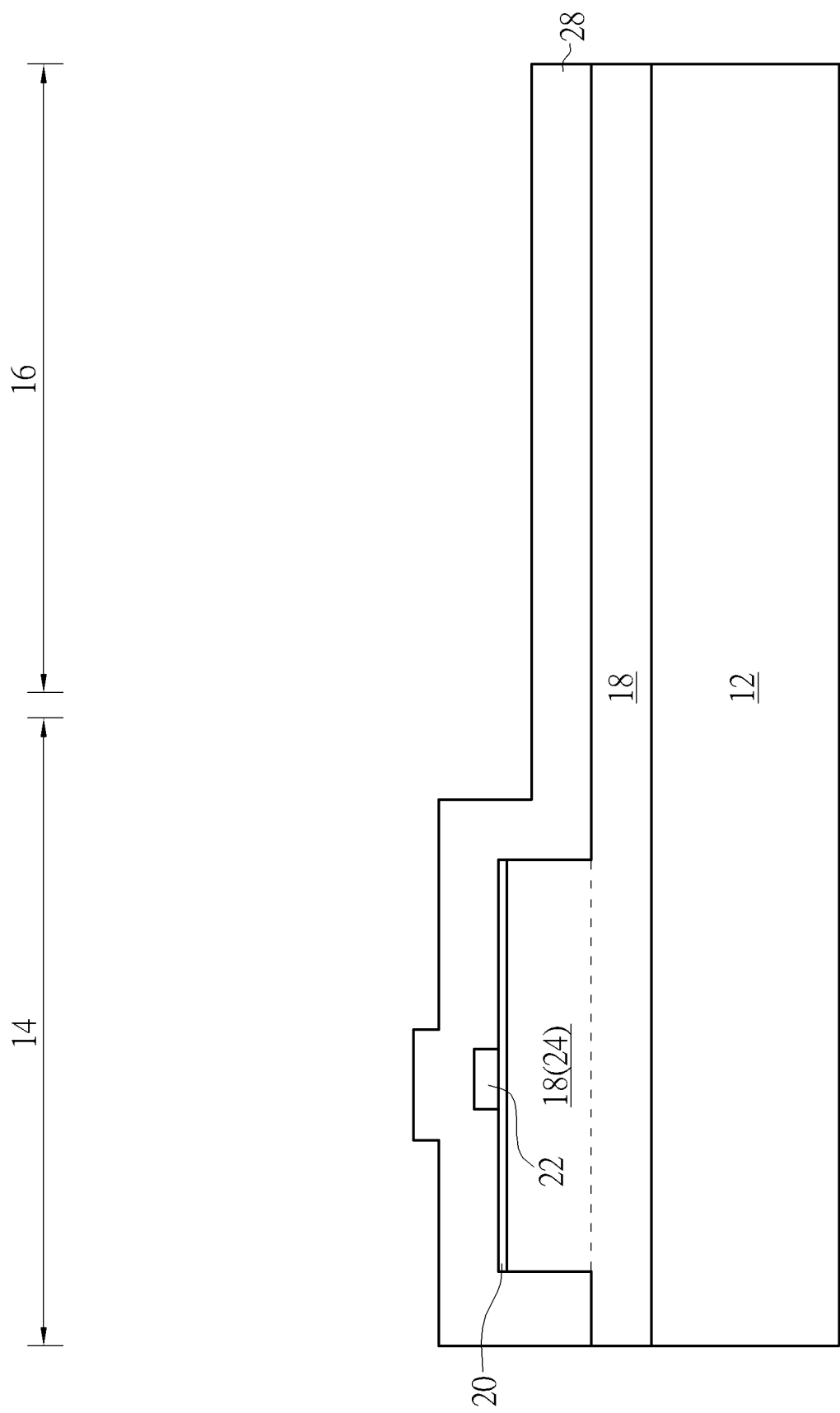
FIGS. 7-9 illustrate a method for fabricating a HEMT according to an embodiment of the present invention.
Figure 8:
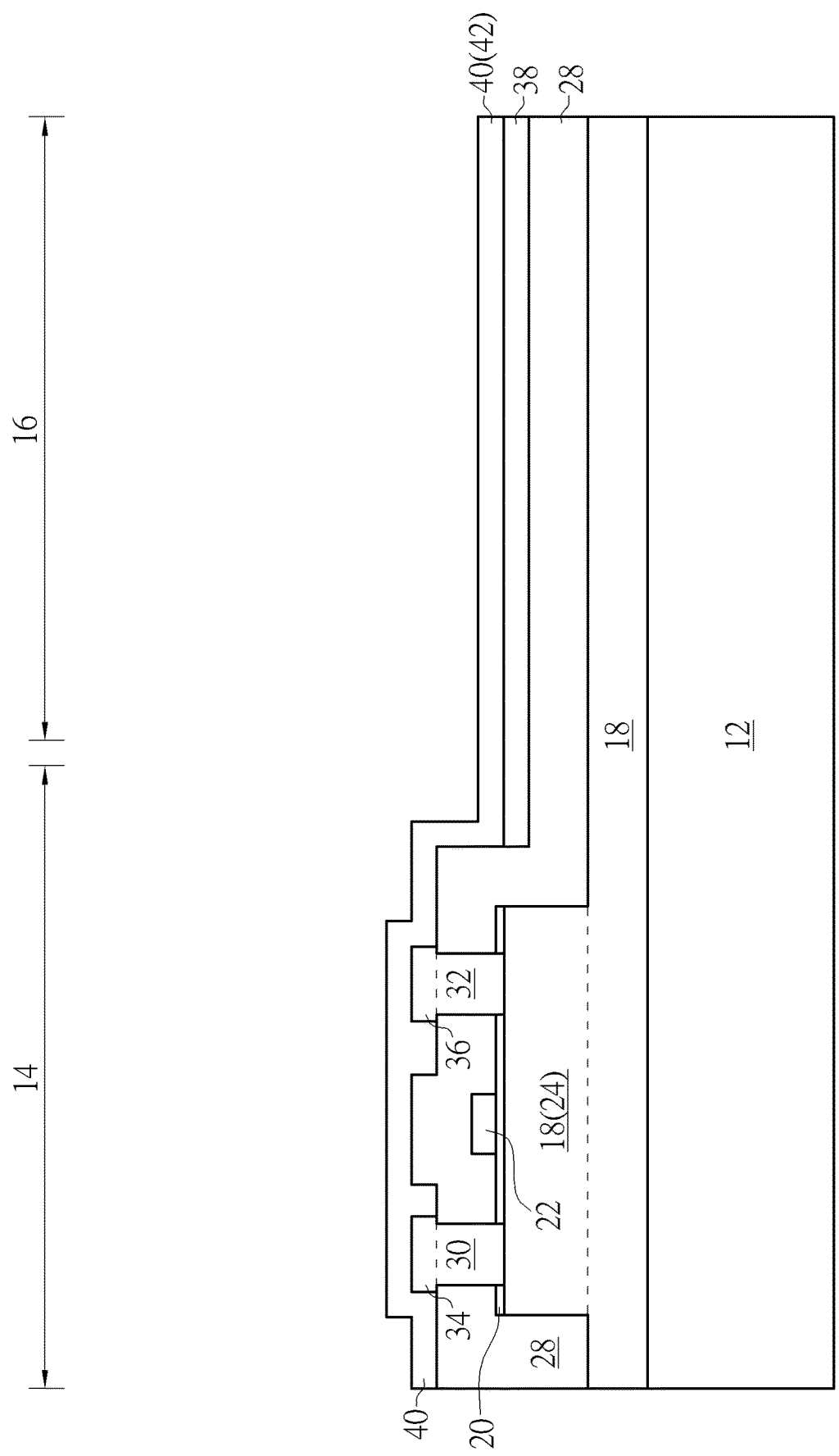
Figure 9:
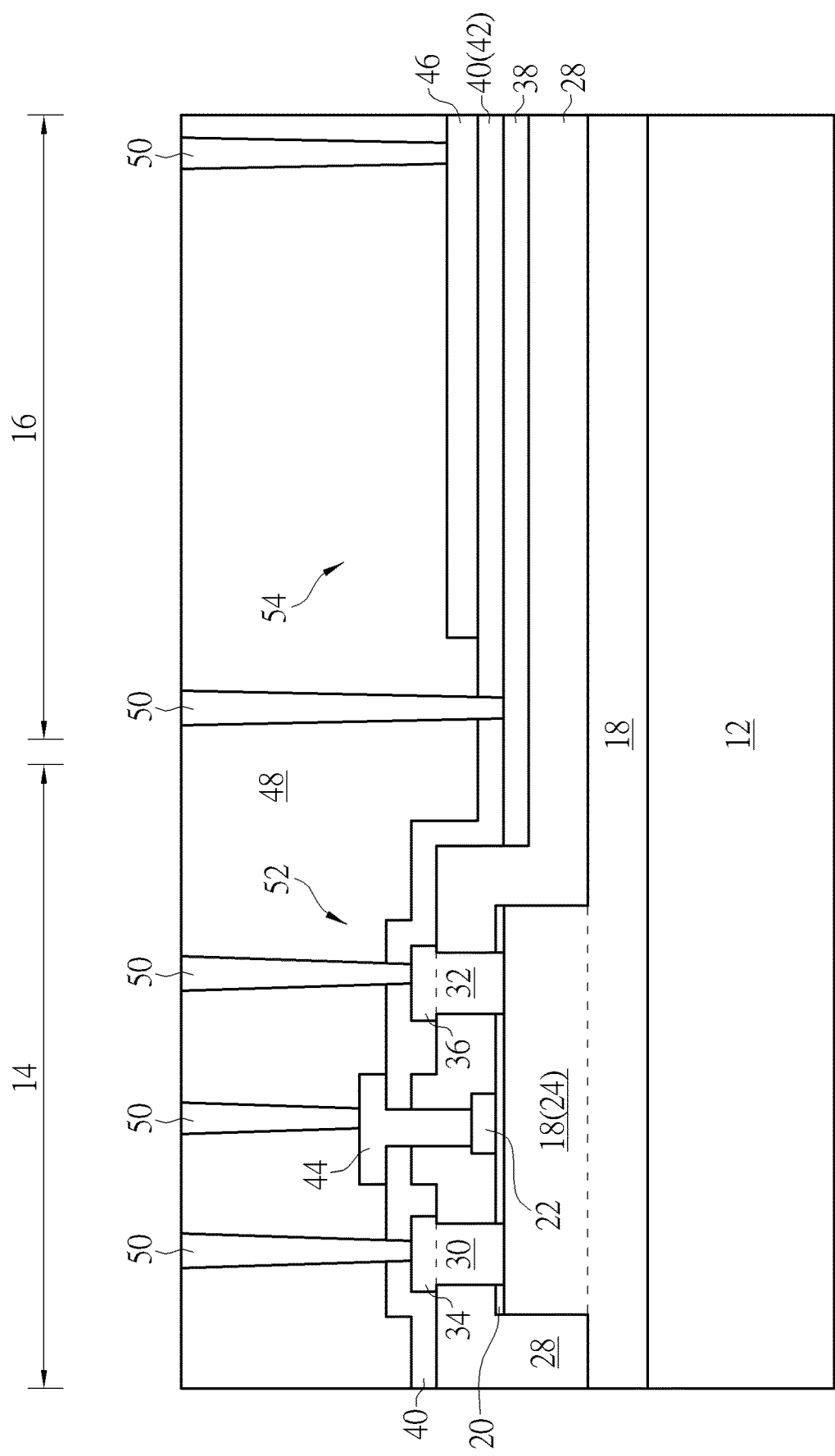

Referring to FIGS. 7-9, FIGS. 7-9 illustrate a method for fabricating a HEMT according to an embodiment of the present invention. For simplicity purpose, elements from the aforementioned embodiments are labeled with same numberings. As shown in the FIG. 7, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate. Next, a HEMT region 14 and a capacitor region 16 are defined on the substrate 12.

Next, a buffer layer 18 is formed on the surface of the substrate 12. According to an embodiment of the present invention, the buffer layer 18 is preferably made of III-V semiconductors such as gallium nitride (GaN), in which a thickness of the buffer layer 18 could be between 0.5 microns to 10 microns. According to an embodiment of the present invention, the formation of the buffer layer 18 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 20 is formed on the surface of the buffer layer 18. In this embodiment, the barrier layer 20 is preferably made of III-V semiconductor such as aluminum gallium nitride ($Al_xGa_{1-x}N$), in which $0<x<1$, x being less than or equal to 20%, and the barrier layer 20 preferably includes an epitaxial layer formed through epitaxial growth process. Similar to the buffer layer 18, the formation of the barrier layer 20 on the buffer layer 18 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. It should be noted that even though the barrier layer 20 is formed directly on the surface of the buffer layer 18, according to another embodiment of the present invention, it would also be desirable to form an extra metal nitride layer (not shown) including but not limited to for example aluminum nitride (AlN) between the buffer layer 18 and the barrier layer 20, which is also within the scope of the present invention.

Next, a p-type semiconductor layer 22 is formed on the barrier layer 20. In this embodiment, the p-type semiconductor layer 22 preferably is a III-V compound layer including p-type GaN (p-GaN) and the formation of the p-type semiconductor layer 22 on the surface of the barrier layer 20 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a MESA isolation process is conducted to form a mesa isolation 24 on the HEMT region 14. In this embodiment, the MESA isolation process could be accomplished by conducting a photo-etching process to remove part of p-type semiconductor layer 22, part of the barrier layer 20, and part of the buffer layer 18, in which the patterned p-type semiconductor layer 22, the patterned barrier layer 20, and the patterned buffer layer 18 preferably share equal widths and edges of the three layers are aligned. The width of the remaining un-patterned buffer layer 18 is preferably equal to the width of the substrate 12. Preferably, the mesa isolation 24 includes a patterned buffer layer 18, in which the thickness of the patterned buffer layer 18 is approximately 300 nm, the thickness of the patterned barrier layer 20 is approximately 10 nm, and the thickness of the patterned p-type semiconductor layer 22 is approximately 100 nm.

Next, a photo-etching process is conducted to remove part of the p-type semiconductor layer 22 on the HEMT region 14, in which the patterned p-type semiconductor layer 22 preferably serves as part of the gate structure for the HEMT device in the later process. Next, a hard mask 28 is conformally formed on the buffer layer 18 to cover the mesa isolation 24 on the HEMT region 14 while extending to the buffer layer 18 on the capacitor region 16. In this embodiment, the hard mask 28 preferably includes silicon nitride and the thickness of the hard mask 28 is approximately 200 nm, but not limited thereto.

Next, as shown in FIG. 8, one or more photo-etching process is conducted to remove part of the hard mask 28 and part of the barrier layer 20 on the HEMT region 14 for forming a plurality of recesses (not shown), a conductive material is formed into the recesses on the HEMT region 14 and onto the surface of the hard mask 28 on the capacitor region 16, and a pattern transfer process is conducted to remove part of the conductive material. Preferably, the conductive material deposited into the recesses on the HEMT region 14 serves as a source electrode 30 and drain electrode 32, the conductive material disposed on the source electrode 30 and drain electrode 32 and extended to the surface of the hard mask 28 adjacent to two sides of the source electrode 30 and drain electrode 32 serves as a source electrode extension 34 and drain electrode extension 36, and the conductive material formed on the surface of the hard mask 28 on the capacitor region 16 preferably serves as a bottom electrode 38 for the capacitor. Next, another hard mask 40 is formed on the surface of hard mask 28 on the HEMT region 14 and extending to the bottom electrode 38 on the capacitor region 16, in which the hard mask 40 on the capacitor region 16 preferably serves as a capacitor dielectric layer 42. In this embodiment, the thickness of the capacitor dielectric layer 42 is between 20-100 nm, but not limited thereto.

Next, as shown in FIG. 9, one or more photo-etching process is conducted to remove part of the hard mask 40 and part of the hard mask 28 on the HEMT region 14 for forming a recess exposing the p-type semiconductor layer 22, another conductive material is formed on the hard mask 40 on HEMT region 14 to fill the recess completely while covering the surface of the hard mask 40 on the capacitor region 16, and a pattern transfer process is conducted to remove part of the conductive material, in which the conductive material deposited into the recess and part of the conductive material on the surface of the hard mask 40 on the HEMT region 14 preferably serves as a T-shape gate electrode 44 while the patterned conductive material layer on the capacitor region 16 serves as a top electrode 46 for the capacitor.

Similar to the aforementioned embodiment, the gate electrode 44, source electrode 30, and drain electrode 32 are preferably made of metal, in which gate electrode 44 preferably includes Schottky metal while the source electrode 30 and the drain electrode 32 are preferably made of ohmic contact metals. According to an embodiment of the present invention, each of the gate electrode 44, source electrode 30, and drain electrode 32 could include gold (Au), silver (Ag), platinum (Pt), titanium (Ti), aluminum (Al), tungsten (W), palladium (Pd), or combination thereof. Moreover, it would be desirable to conduct an electroplating process, sputtering process, resistance heating evaporation process, electron beam evaporation process, physical vapor deposition (PVD) process, chemical vapor deposition (CVD) process, or combination thereof to form conductive materials in the aforementioned recesses and then pattern the conductive materials through single or multiple etching processes for forming the gate electrode 44, the source electrode 30, and the drain electrode 32.

Next, a contact plug formation could be conducted to form contact plugs 50 electrically connected to the gate electrode 44, source electrode 30, and drain electrode 32 on the HMET region 14 and the bottom electrode 38 and top electrode 46 on the capacitor region 16. In this embodiment, the formation of contact plugs 50 could be accomplished by first forming an interlayer dielectric (ILD) layer 48 on the hard mask 40 on both HEMT region 14 and capacitor region 16, removing part of the ILD layer 48 and part of the hard mask 40 to form contact holes (not shown), and then depositing a barrier layer (not shown) and a metal layer (not shown) into the contact holes. A planarizing process, such as chemical mechanical polishing (CMP) process is then conducted to remove part of the metal layer, part of the barrier layer, and even part of the ILD layer 48 to form contact plugs 50 in the contact holes, in which the top surface of the contact plugs 50 is even with the top surface of the ILD layer 48. In this embodiment, the barrier layer is selected from the group consisting of Ti, Ta, TiN, TaN, and WN and the metal layer is selected from the group consisting of Al, Ti, Ta, W, Nb, Mo, and Cu.

Referring again to FIG. 9, FIG. 9 further illustrates a structural view of a semiconductor device according to an embodiment of the present invention. As shown in FIG. 9, the semiconductor device preferably includes a HEMT region 14 and a capacitor region 16 defined on the substrate 12, a mesa isolation 24 disposed on the HEMT region 14, a HEMT 52 disposed on the mesa isolation 24, a hard mask 28 surrounding the HEMT 52 and extending to the capacitor region 16, a capacitor 54 disposed on the capacitor region 16, and a buffer layer 18 disposed between the mesa isolation 24, the capacitor 54, and the substrate 12, in which the mesa isolation 24 and the buffer layer 18 both include GaN.

The HEMT 52 includes a barrier layer 20 disposed on the mesa isolation 24, a p-type semiconductor layer 22 disposed on the barrier layer 20, a gate electrode 44 disposed on the p-type semiconductor layer 22, a source electrode 30 and drain electrode 32 adjacent to two sides of the gate electrode 44, a source electrode extension 34 disposed on the source electrode 30, and a drain electrode extension 36 disposed on the drain electrode 32.

The capacitor 54 on the other hand includes a bottom electrode 38 disposed on the hard mask 28, a capacitor dielectric layer 42 disposed on the bottom electrode 38 while extending to the top surface and sidewall of the hard mask 28 on the HEMT region 14, and a top electrode 46 disposed on the capacitor dielectric layer 42. In contrast to the bottom electrode 38 disposed directly on the buffer layer 18 while the overall thickness of the bottom electrode 38 is equivalent to the combined thickness of the source electrode 30 and source electrode extension 34 or the combined thickness of drain electrode 32 and drain electrode extension 36 on HEMT region 14 in the aforementioned embodiment, the thickness of the bottom electrode 38 in this embodiment is only equal to the overall thickness of the source electrode extension 34 or drain electrode extensions 36 on the HEMT region 14. Preferably, the overall thickness of the bottom electrode 38 is about 100 nm, the thickness of the capacitor dielectric layer 42 is between 20-100 nm, and the thickness of the top electrode 46 is about 100 nm.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a high electron mobility transistor (HEMT) region and a capacitor region;
   forming a buffer layer on the substrate;
   forming a mesa isolation on the HEMT region;
   forming a HEMT on the mesa isolation; and
   forming a capacitor on the capacitor region, wherein a bottom electrode of the capacitor contacts the buffer layer directly.

2. The method of claim 1, wherein the mesa isolation and the buffer layer comprise gallium nitride (GaN).

3. The method of claim 1, further comprising:
   forming a barrier layer on the mesa isolation;
   forming a p-type semiconductor layer on the barrier layer;
   forming a hard mask on the p-type semiconductor layer;
   forming a source electrode and a drain electrode adjacent to two sides of the p-type semiconductor layer;
   forming the bottom electrode on the capacitor region;
   forming a capacitor dielectric layer on the hard mask;
   forming a gate electrode on the HEMT region; and
   forming a top electrode on the capacitor region.

4. The method of claim 3, further comprising:
   forming the hard mask on the mesa isolation and extending from the HEMT region to the capacitor region;
   patterning the hard mask to form recesses; and
   forming the source electrode, the drain electrode, and the bottom electrode in the recesses.

5. The method of claim 3, wherein the capacitor dielectric layer extends from the HEMT region to the capacitor region.

* * * * *